(12) United States Patent
Roizin et al.

(10) Patent No.: US 7,700,994 B2
(45) Date of Patent: Apr. 20, 2010

(54) SINGLE POLY CMOS LOGIC MEMORY CELL FOR RFID APPLICATION AND ITS PROGRAMMING AND ERASING METHOD

(75) Inventors: Yakov Roizin, Migdal Haemek (IL); Evgeny Pikhay, Migdal Haemek (IL); Efraim Aloni, Migdal Haemek (IL); Adi Birman, Migdal Haemek (IL); Daniel Nehmad, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 111 days.

(21) Appl. No.: 11/936,718

(22) Filed: Nov. 7, 2007

(65) Prior Publication Data
US 2008/0137408 A1 Jun. 12, 2008

Related U.S. Application Data

(60) Provisional application No. 60/869,081, filed on Dec. 7, 2006, provisional application No. 60/869,520, filed on Dec. 11, 2006.

(51) Int. Cl.
*H01L 29/788* (2006.01)
(52) U.S. Cl. ........................... 257/315; 257/322
(58) Field of Classification Search ............ 257/315, 257/322
See application file for complete search history.

(56) References Cited

U.S. PATENT DOCUMENTS

| | | | |
|---|---|---|---|
| 5,272,368 A | 12/1993 | Turner et al. | |
| 5,619,942 A | 4/1997 | Stewart et al. | |
| 5,912,509 A | 6/1999 | Kasai et al. | |
| 6,146,939 A | 11/2000 | Dasgupta | |
| 6,483,139 B1 | 11/2002 | Arimoto et al. | |
| 6,489,650 B2 | 12/2002 | Kumazaki | |
| 6,788,576 B2 | 9/2004 | Roizin | |
| 6,818,943 B2 | 11/2004 | Kumazaki | |
| 6,842,327 B1 | 1/2005 | Diorio et al. | |
| 2006/0033141 A1 | 2/2006 | Okazaki et al. | |
| 2007/0166912 A1 | 7/2007 | Fenigstein et al. | |
| 2007/0279987 A1* | 12/2007 | Fang et al. ............. | 365/185.18 |

OTHER PUBLICATIONS

Buchanan: "Scaling the gate dielectric: Materials, Integration and Reliability", IBM J. Res. Develop. vol. 43, No. 3, May 1999, pp. 245-264.
Chang et al. "A Low Voltage, Low Power P-Channel EEPROM Cell for Embedded and System-On-A-Chip Applications", pp. 1-4.
Kwok "An Innovative NVM Technology for Sub-0.25 μm SOC Applications", Programmable Microelectronics Corp. (PMC) Flash, CASPA/CIE System-on-Chip (SOC) Symposium, May 16, 1998, pp. 1-24.
Lee et al. "High-Performance EEPROM's Using N- and P-Channel Polysilicon Thin-Film Transistors with Electron Cyclotron Resonance $N_2O$-Plasma Oxide", IEEE Electron Device Letters, vol. 20, No. 1, Jan. 1999, pp. 15-17.

* cited by examiner

*Primary Examiner*—Phat X Cao
(74) *Attorney, Agent, or Firm*—Bever, Hoffman & Harms, LLP; Patrick T. Bever

(57) ABSTRACT

An electrically erasable/programmable CMOS logic memory cell for RFID applications and other mobile applications includes a tunneling capacitor, a control capacitor, and a CMOS inverter that share a single floating gate. A two-phase program/erase operation performs an initial Fowler-Nordheim (F-N) injection phase using the capacitors, and then a Band-to-Band Tunneling (BBT) phase using the CMOS inverter. Both the F-N injection and BBT phases are performed using low currents and low voltages (i.e., 5V or less). The tunneling and control capacitors are fabricated in isolated P-wells (IPWs) including both N+ and a P+ regions to enable the use of both positive and negative programming voltages during the F-N and BBT programming/erasing operations.

13 Claims, 8 Drawing Sheets

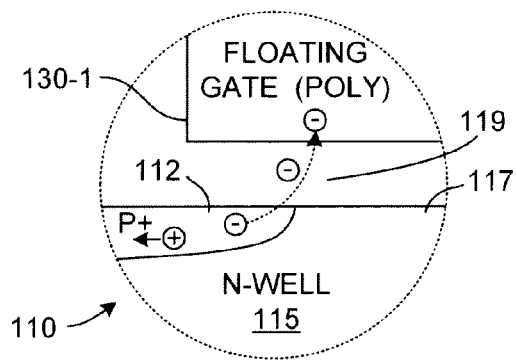
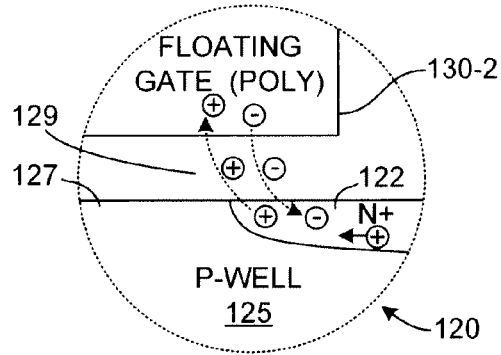
FIG. 5(A)  FIG. 5(B)
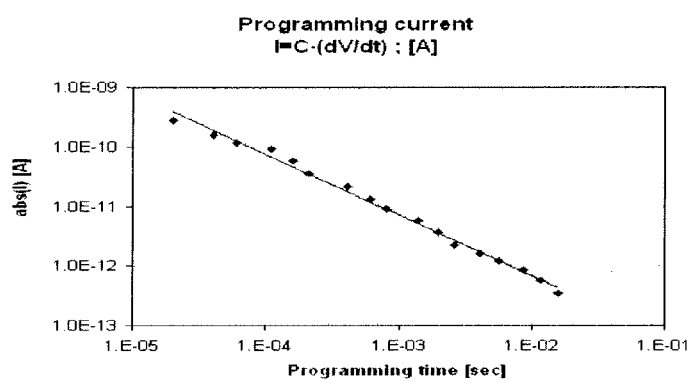
FIG. 6(A)
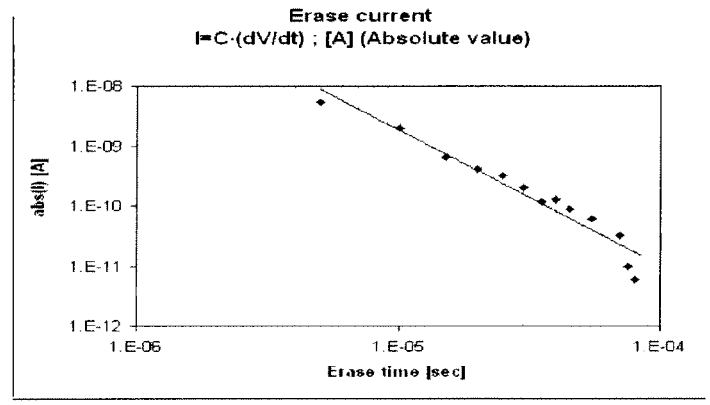
FIG. 6(B)

SINGLE POLY CMOS LOGIC MEMORY CELL FOR RFID APPLICATION AND ITS PROGRAMMING AND ERASING METHOD

RELATED APPLICATION

This application claims priority of U.S. Provisional Patent Application 60/869,081, entitled "Single Poly CMOS Logic Memory Cell For RFID Application And Its Programming And Erasing Method" filed Dec. 7, 2006.

This application also claims priority of U.S. Provisional Patent Application 60/869,520, entitled "A CMOS Inverter Based Logic Memory" filed Dec. 11, 2006.

FIELD OF THE INVENTION

This invention relates to complimentary metal-oxide-silicon (CMOS) integrated circuit (IC) devices, and more particularly to memories for passive radio frequency identification (RFID) CMOS IC devices and other mobile applications.

BACKGROUND OF THE INVENTION

A radio frequency identification (RFID) system identifies unique items using an interrogator and an RFID device (sometimes referred to as a "tag"). Typically, the interrogator communicates with the RFID device that is attached to an item. The interrogator, also known as a reader, communicates with the RFID device through radio frequency signals, and passes the information read from the RFID device in digital form to a computer system. The RFID device is typically a microchip that stores the digital information using non-volatile memory cells. The microchip is attached to an antenna for communication with the interrogator. The RFID device includes a unique serial number and may include other information, such as a customer account number.

RFID devices can be active, passive, or semi-passive. Active RFID devices include a power source that powers the microchip's circuitry and transmits a signal to the interrogator. Passive RFID devices do not include a power source, and draw all the power required for the circuitry and the transmission of information from the radio frequency electromagnetic field generated by the interrogator. Semi-passive tags are similar to active tags, but their power source is only used to run the microchip's circuitry, not to communicate with the interrogator.

The present invention is directed to passive RFID devices, wherein all power supplied to RFID devices is provided by the RF signal transmitted from the interrogator, and therefore must exhibit low power consumption of the embedded non-volatile memory in all operational states: programming, erasing, and readout. The currents utilized to facilitate the operational states of the non-volatile memory should typically not exceed 100 nA per cell (especially during flash erase operations), while the program/erase times must relatively short (less than several milliseconds). An additional requirement is that read-out operations must be performed at low voltages (i.e., at the level of 1V or below), because otherwise power-consuming additional charge pumps must be included in the RFID chip design. Moreover, the passive RFID device must be inexpensive to manufacture (i.e., not requiring additional masks or process steps in addition to the core CMOS process flow).

There are several conventional RFID device memory cell types.

A first type of RFID memory cell type uses the CMOS inverter principle for readout and is programmed by band-to-band tunneling (BBT) generated electrons and erased by BBT generated holes. This first RFID memory cell type is disclosed, for example, in U.S. Pat. No. 6,788,576 (Complementary non-volatile memory cell; Yakov Roizin, 2004), which is incorporated herein by reference in its entirety. An advantage of this cell is that it requires very low read-out currents due to utilization of the CMOS inverter read-out principle. In addition, much lower program-erase currents (of the order of 300-500 nA, programming time approximately 100 µs, erase time approximately 20 ms) compared with memories employing channel-hot-electron (CHE) for programming. CHE programming requires at least tens of microAmps (see, e.g., U.S. Pat. No. 5,619,942, Stewart et al., 1997)). Another advantage of BBT electron and hole injection mechanisms is their efficiency. In particular, one can strongly decrease the transfer point Vm of the FG CMOS inverter. A strongly negative Vm can be achieved using the voltages of the core CMOS circuit (below 5V), thus allowing sufficient erase margins with low $V_{read}$ voltages.

Despite the mentioned advantages, the currents used in pure BBT programming/erasing single polycrystalline silicon memory devices are higher than required in modern passive RFID devices.

A solution that also employs a CMOS floating gate (FG) inverter, but uses Fowler-Nordheim (F-N) injection mechanism for charging and discharging the FG is disclosed in U.S. Pat. No. 5,272,368(Turner, 1993). In the disclosed embodiments, special capacitors in the substrate are used: one is a tunneling capacitor through which the FG is charged and discharged, the second capacitor is a control capacitor. There are several limitations in the solution taught by Turner. First, it is difficult to erase a charge on the floating gate to negative values with small voltages (i.e., to extract electrons from the floating gate, or inject holes) because the value of the F-N current is exponentially dependent on the electric field in the tunnel oxide. The current significantly decreases during the erase operation. Attempts to use very high voltages (fields in the gate oxide exceeding 15 MV/cm) result in reliability limitations. Tunneling oxide charge-to-breakdown (Qbd) strongly decreases with the increase of the electrical field, thus limiting the device's endurance (i.e., the effective number of program/erase cycles; see, e.g., D. A. Buchanan "Scaling of gate dielectrics: Materials, Integration and Reliability, IBM Journal of R&D, v. 43, 1999, pp. 245-264). Also, special implants (diffusions) are disclosed in U.S. Pat. No. 5,272,368 to fabricate tunnel and control capacitors. These implants require additional masking steps if implemented in standard CMOS process flows. Moreover, when high voltages are employed for programming and erase (programming with plus 12V at control capacitor, tunnel capacitor terminal grounded, erase with 12V at tunnel capacitor, control capacitor terminal grounded, excess currents (usually of "gate induced drain leakage" (GIDL) origin) flow in the peripheral circuits.

What is needed is a non-volatile (floating gate) memory cell that avoids the problems associated with the prior art structures discussed above. In particular, what is needed is an electrically erasable/programmable CMOS logic memory cell and associated programming/erasing algorithm that functions at both the low voltages and low currents associated with passive RFID applications. What is also needed is an electrically erasable/programmable CMOS logic memory cell and associated programming/erasing algorithm that functions at low voltages for use in other mobile devices, such as active RFID devices and hand-held electronic devices that have a limited power source (e.g., a battery).

SUMMARY OF THE INVENTION

The present invention is directed to an electrically erasable/programmable CMOS logic memory cell for RFID applications that includes a tunneling capacitor, a control capacitor, and a CMOS inverter that share a single floating gate, and also a two-phase program/erase operation in which the capacitors are used to perform an initial Fowler-Nordheim (F-N) injection phase of the program/erase operation, and then the CMOS inverter is used to perform a Band-to-Band Tunneling (BBT) phase of the program/erase operation. By performing F-N injection phase during the initial phase of the program/erase operation and BBT during the second phase, the present invention provides a scheme for programming/erasing the memory cell using both low voltage (i.e., 5V or less) and low current, making the memory cell well suited to use in passive RFID devices. In particular, by performing the initial F-N injection phase, the combined "F-N+BBT" scheme takes advantage of the high potential between the initial (programmed/erased) state of the floating gate and the system voltage to perform low current F-N injection, whereby the charge on the floating gate is changed from its initial charge state to an intermediate charge state. As the difference between the floating gate and the system voltage and the F-N injection process decreases exponentially, the combined "F-N+BBT" scheme changes the control voltages applied to the memory cell such that the PMOS transistor of the CMOS inverter is used to induce the BBT phase of the program/erase operation, whereby the charge stored on the floating gate is changed from the intermediate charge generated by the F-N phase to the desired final (i.e., erased/programmed) charge level. By implementing BBT only after the F-N phase is used to reduce the vertical field between the intermediate stored charge and the system voltage, the BBT phase is also performed using low current and low voltage. Therefore, by facilitating a combined "F-N+BBT" program/erase scheme, the present invention facilitates program/erase operations for non-volatile memory cells that requires substantially less current and voltage than required using conventional methods, thus making the present invention well suited to RFID applications.

In accordance with an aspect of the present invention, the tunneling capacitor and the control capacitor are fabricated in isolated P-wells (IPWs) that are located below corresponding portions of the floating gate. Each of the IPWs includes both an N+ and a P+ region that are coupled to the control circuitry to enable the application of both positive and negative programming voltages (e.g., +5V/–5V or below) during the F-N and BBT programming/erasing operations.

In accordance with another embodiment of the present invention, the electrically erasable/programmable CMOS logic memory cell is utilized in other mobile devices and subjected to program/erase operations other than the F-N+BBT scheme described above. In alternative embodiments, the floating gate is programmed/erased using BBT or F-N operations (not both during the same process, as described above). Although these alternative program/erase operations require additional current, these operations are performed using low voltages (i.e., 5V or less), thereby making the electrically erasable/programmable CMOS logic memory cell of the present invention suitable for other mobile applications, such as active RFID devices and hand-held electronic devices. Additional features related to optimized layout and improved performance (i.e., minimized cell area, and decreased operating voltages and currents) are also disclosed.

BRIEF DESCRIPTION OF THE DRAWINGS

These and other features, aspects and advantages of the present invention will become better understood with regard to the following description, appended claims, and accompanying drawings, where:

FIGS. 5(A) and 5(B) are partial cut-away views illustrating a programming operation and an erase operation of the memory cell of FIG. 1;

FIGS. 6(A) and 6(B) are graphs showing currents generated in the memory cell of FIG. 1 during the F-N phase of the F-N+BBT scheme;

DETAILED DESCRIPTION OF THE DRAWINGS

The present invention relates to an improvement in non-volatile memory cells. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. The terms "coupled" and "connected", which are utilized herein, are defined as follows. The term "connected" is used to describe a direct connection between two circuit elements or nodes, for example, by way of a metal line that are formed in accordance with normal integrated circuit fabrication techniques. In contrast, the term "coupled" (without the modifier "capacitively") is used to describe either direct or indirect connection between two circuit elements or nodes. For example, two coupled elements may be directly connected by way of a metal line, or indirectly connected by way of an electromagnetic or intervening circuit element (e.g., a capacitor, resistor, inductor, or by way of the source/drain terminals of a transistor). The phrase "capacitively coupled" is used herein to describe the intentional placement of two circuit structures (e.g., the plates of a capacitor) such that a significant transfer of the voltage applied to the first circuit structure to the second circuit structure is facilitated by means of the capacitance between the two circuit structures. The term "polysilicon floating gate" is used herein to describe a polysilicon structure that is entirely isolated from signal-carrying conductive structures (i.e., is entirely surrounded by electrically insulating (dielectric) material). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
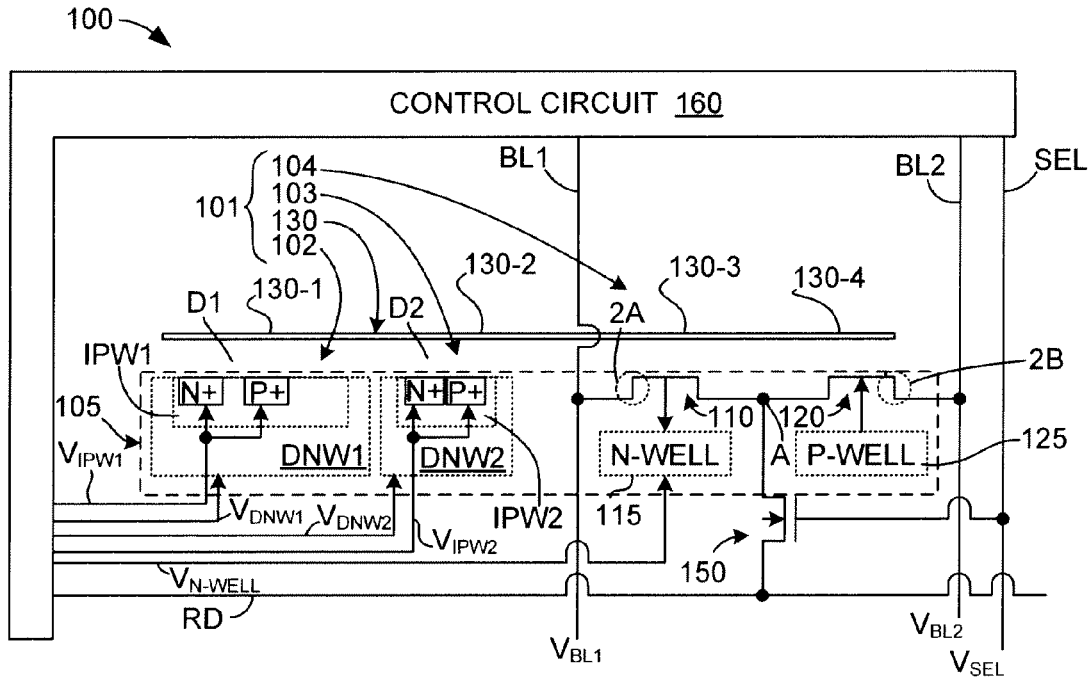
FIG. 1 is a modified schematic view showing a CMOS IC device including an electrically erasable and programmable CMOS logic memory cell according to an embodiment of the present invention.

FIG. 1 is a modified schematic diagram showing a portion of an integrated circuit (IC) 100 including an electrically erasable and programmable CMOS logic memory cell 101 according to a generalized embodiment of the present invention. CMOS logic memory cell 101 includes two capacitors 102 and 103 and a CMOS complementary non-volatile memory (CNVM) inverter 104 that are fabricated in a common semiconductor (e.g., silicon) substrate 105 such that they share a single polycrystalline silicon (polysilicon) floating gate 130. The operation of CMOS logic memory cell 101 is controlled in the manner described below by way of signals generated by a control circuit 160, which is shown in generalized block form and described functionally herein. Portions of control circuit 160 are formed in substrate 105 and connected/coupled to logic memory cell 101 according to known fabrication techniques, and a suitable circuit configuration for implementing control circuit 160 is understood by those skilled in the art.

In accordance with an aspect of the present invention, each capacitor 102 and 103 of non-volatile logic cell 101 includes an isolated P-well (IPW) region formed in substrate 105, a corresponding portion of floating gate 130, and a dielectric region disposed therebetween. In particular, (first) capacitor 102 includes a first IPW region IPW1 formed in a first deep N-well region DNW1, a first region 130-1 of floating gate 130, and a first dielectric region D1 disposed between first region 130-1 of floating gate 130 and IPW region IPW1 (deep N-well region DNW1). Similarly, (second) capacitor 103 includes a second IPW region IPW2 formed in a second deep N-well region DNW2, a second region 130-2 of floating gate 130, and a second dielectric region D2 disposed between IPW region IPW2 and deep N-well region DNW2. Isolated P-well regions IPW1 and IPW2 and deep N-well regions DNW1 and DNW2 are formed using known techniques (e.g., by way of a standardized 0.18 μm CMOS fabrication flow including a deep N-well fabrication step). The voltage potentials across capacitors 102 and 103 are respectively controlled by signals $V_{IPW1}$ and $V_{IPW2}$, which are respectively applied to isolated P-well regions IPW1 and IPW2 by control circuit 160 in the manner described below. In one embodiment, each isolated P-well region IPW1 and IPW2 includes both N+ and P+ implantations in order to eliminate substrate depletion effects (i.e., to keep capacitances high for both positive and negative polarities used during FN program/erase operations, as described below).

Capacitor 102 is formed according to known techniques by controlling the thickness of the high voltage dielectric (e.g., buried oxide (BOX) layer) region D1, typically in the range of approximately 70-100 angstroms in the present embodiment, between the polysilicon of floating gate portion 130-1 and an IPW region IPW1, and IPW region IPW1 has an area of approximately 20 micrometers square. Similarly, capacitor 103 is formed according to known techniques by controlling the thickness of dielectric region D2 typically in the range of approximately 70-100 angstroms in the present embodiment, between the polysilicon of floating gate portion 130-1 and a IPW region IPW1, and IPW region IPW2 has an area of approximately 1 micrometer square. In a particularly preferred embodiment, IPW regions IPW1 and IPW2 are doped using a suitable ion implantation process to achieve an impurity concentration of approximately $5*10^{17}$ $1/cm^3$. The capacitors have butted N+ and P+ diffusions (with salicide) to exclude the depletion effects when working at two polarities of the applied voltage.

Inverter 104 includes both a p-channel non-volatile memory (NVM) transistor 110 and an n-channel NVM transistor 120 that utilize a second region of floating gate structure 130. In particular, p-channel transistor 110 includes source and drain regions (terminals) that are separated by a channel region and formed in an n-type well (N-WELL) 115, and a third portion 130-1 of shared floating gate structure 130 extending over the channel region between the source and drain regions and separated by a suitable gate oxide. Similarly, n-channel transistor 120 includes source and drain regions that are formed in a p-type well (P-WELL) 125 and separated by a channel region, and a fourth portion 130-4 of shared floating gate structure 130 extending over the channel region between the source and drain regions and separated by a suitable gate oxide. The drains of p-channel transistor 110 and n-channel transistor 120 are connected together at a node A, which in turn is connected to one terminal of a select transistor 150.

Inverter 104 is connected into an associated array by several control lines that are shared by associated cells (not shown) and are controlled by a control circuit 160 of IC 100. Specifically, the source terminal of p-channel transistor 110 is connected to a first bit line BL1, which is controlled by control circuit 160 to carry a first bit line control signal $V_{BL1}$. Similarly, the source of n-channel transistor 120 is connected to a second bit line BL2, which is controlled by control circuit 160 to carry second bit line control signal $V_{BL2}$. Select transistor 150 is a "normal" (i.e., volatile) n-channel FET connected between node A and a read bit line (RD), and has a gate terminal connected to a select line (SEL), which is controlled by control circuit 160 to carry a row select signal $V_{SEL}$. Control circuit 160 also generates a bias voltage signal $V_{N-WELL}$ that is applied to n-well 115, and is typically transmitted to the n-well regions associated with an entire column of CNVM cells, not to each cell individually. P-well region 125 is coupled to the substrate.

Inverter 104 is fabricated and functions in a manner similar to that described in co-owned U.S. Pat. No. 6,788,576, which is incorporated herein by reference in its entirety. In particular, transistors 110 and 120 of inverter 104 have special drain engineering to optimize the electron and hole BBT from p-channel transistor 110 and n-channel transistor 120, respectively. Only implants existing in the core CMOS process flow are used for this purpose, meaning that no additional masks or special implants are added to the core CMOS process flow, and all drain engineering is performed using a combination of the implants already used in the core CMOS process flow.

In accordance with the conventional utilized herein, floating gate 130 is "programmed" when it stores a net negative charge, and is "erased" when the net negative charge is removed or floating gate 130 stores a net positive charge. In particular, floating gate 130 is "programmed" when it stores a negative charge that is sufficient to turn on p-channel transistor 110 during read operations. Similarly, floating gate 130 is "erased" when the net negative charge is removed or it stores a net positive charge that is sufficient to turn on n-channel transistor 120 during read operations.

Figure 2:
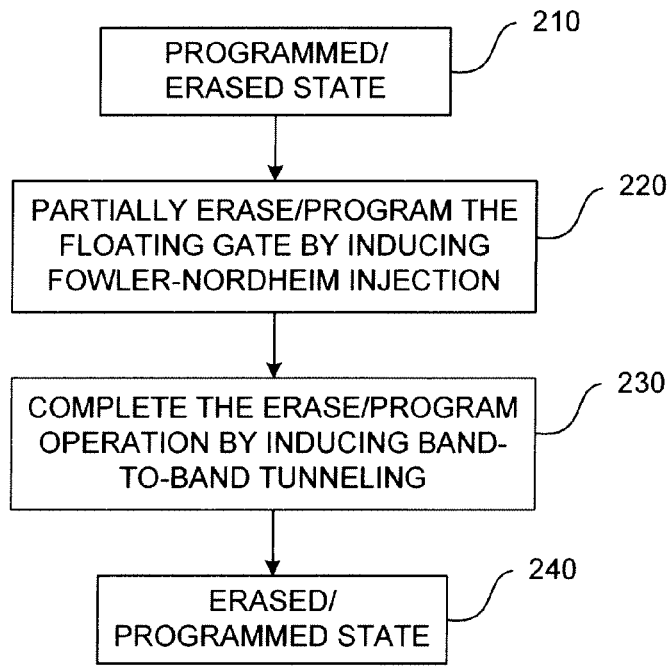
FIG. 2 is a flow diagram showing a two phase program/erase operation according to another embodiment of the present invention.

FIG. 2 is a flow diagram depicting a program/erase operation performed in accordance with another aspect of the present invention. In particular, block 210 illustrates floating gate 130 (FIG. 1) in one of an erased state (e.g., such that the charge stored on floating gate 130 generates a transfer point Vm of inverter 104 that is approximately −1.0V to −3V) or a programmed state (e.g., such that the charge stored on floating gate 130 generates a transfer point Vm of inverter 104 that is approximately +3V). According to the present invention, control circuit 160 facilitates low-voltage programming and erasing of floating gate 130 by inducing Fowler-Nordheim (F-N) injection during a first phase of the program/erase operation (block 220), and then inducing Band-to-Band Tunneling (BBT) during a second phase of the program/erase operation (block 220), thereby achieving full erasure/programming of floating gate 130 (block 240). In particular, the present invention implements F-N injection using capacitors 102 and 103 during the first phase while the potential between the charge stored on floating gate 130 and the available system voltage (e.g., 5V) is relatively high, thereby producing a highly efficient low current transfer of holes/electrons between floating gate 130 and IPWs (IPW1 and IPW2). As discussed above and in further detail below, the F-N injection process exponentially decreases as the potential between floating gate 130 and IPWs IPW1 and IPW2 decreases. At this point, the F-N injection process is terminated and BBT is induced by way of inverter 104 to complete the erase/program operation. By utilizing BBT only during the second phase of the erase/program operation, the erase/program operation is performed using a substantially lower current than when BBT current is solely used because the vertical field (voltage potential) between floating gate 130 and the programming voltage has been substantially decreased by the F-N tunneling phase. Accordingly, the present invention facilitates low current and low voltage program/erase operations that are optimized for use, for example, in passive RFID devices.

Referring again to FIG. 1, in a practical example, memory cell 101 is programmed as follows. With memory cell 101 in an erased state (e.g., −1V), programming begins by applying voltages of approximately +4.5V to IPW IPW1 (i.e., "control" capacitor 102) and approximately −4.5V to IPW region IPW2 (i.e., "tunneling" capacitors 103). Bit lines BL1 and BL2 and node A are maintained at zero volts (0V) or are isolated (floating) during the first programming phase. Under these conditions, the main portion of voltage drops on tunneling capacitor 103 (~90% for the geometry employed in our experiments), and F-N injection of electrons is induced from IPW region IPW2 into floating gate 130.

In a practical example, with memory cell 101 in a programmed state, an erase operation begins by applying voltages of approximately −4.5V to IPW IPW1 (i.e., "control" capacitor 102) and approximately +4.5V to IPW region IPW2 (i.e., "tunneling" capacitors 103). Bit lines BL1 and BL2 and node A are maintained at zero volts (0V) or are isolated (floating) during the first erase phase. Under these conditions, the main portion of voltage drops on tunneling capacitor 103, and electrons are removed from the floating gate into the IPW by Fowler-Nordheim injection.

Figure 3:
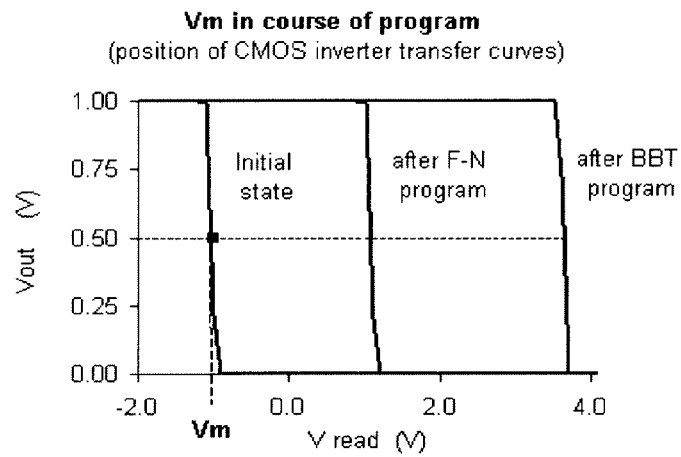
FIG. 3 is a graph showing initial, intermediate and final transfer point voltages associated with the logic memory cell memory cell of FIG. 1 during the two phase program/erase operation of FIG. 2.

FIG. 3 shows the transfer point Vm (i.e., the transfer curve positions of CMOS inverter 104) before (curve 1) and after programming with F-N (curve 2) and then with BBT (curve 3). Note that transfer point Vm changes in response to the changing charge on floating gate 130 from an initial value (i.e., when floating gate 130 stores a first programmed/erased charge) to an intermediate value after the F-N phase is completed (i.e., when floating gate 130 stores a second (intermediate) charge that is between the initial programmed/erased charge and the desired erased/programmed charge), and then to a final value after the BBT phase is completed (i.e., when floating gate 130 stores a final (third) erased/programmed charge). In the example shown in FIG. 3, the initial charge is approximately −1V, and changes to approximately +1.5V after the F-N (first) phase, and then to approximately +3.5V after the BBT (second) phase. Transfer point Vm characterizes the most steep point of the CMOS inverter transfer curve (approximately ½ of Vcc; Vcc=1V in our case). The read out voltage in products based on the discussed principle is selected between the Vm values for programmed and erased state. For measurement of the transfer curve the voltage at the control gate is linearly increased. The output voltage $V_{OUT}$ of the CMOS inverter is Vcc or zero (except for voltages close to Vm, where the inverter is switched from Vcc to zero)).

Figure 4A:
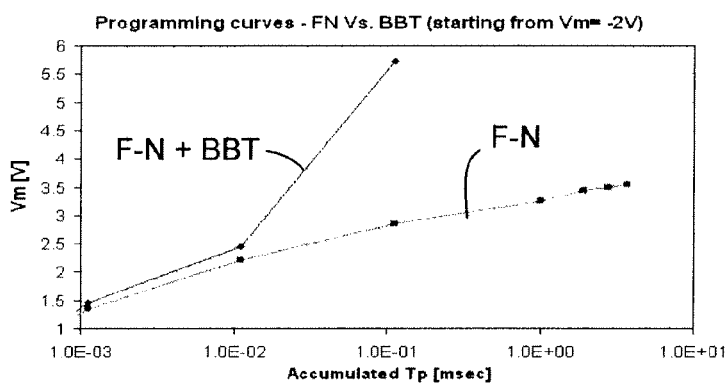
FIGS. 4(A) and 4(B) are graphs contrasting program/erase operations using conventional F-N injection and the combined F-N+BBT scheme of the present invention.
Figure 4B:
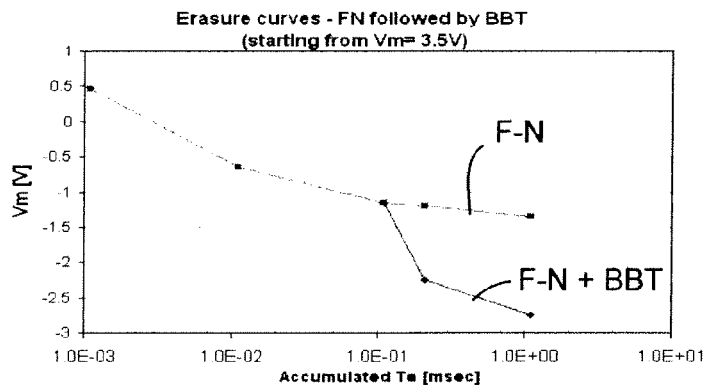

FIGS. 4(A) and 4(B) show the kinetics of transfer point Vm changes for F-N only programming/erase and combined F-N and BBT ("F-N+BBT") programming/erase operation performed in accordance with the present invention, respectively. In particular, FIG. 4(A) shows programming curves for F-N Vs. F-N+BBT programming operations, and FIG. 4(B) shows erase curves for F-N Vs. F-N+BBT erase operations. These graphs show that transfer point Vm in programming and erase by F-N mechanism only saturate at values of approximately 3V and −1.5V, respectively, for program/erase times of approximately 1 ms (voltages at IPW1 and IPW2=±4.5V). At the same time, employing the two step algorithm easily facilitates reaching transfer point values of greater than 5V and less than −4V for program/erase Vm levels.

In one embodiment the second (BBT) phase begins approximately 0.01 to 0.1 milliseconds (ms) after the F-N phase is started. Referring to FIG. 1, during the BBT phase of a programming operation, IPW regions IPW1 and IPW2 are maintained at +4.5V, bit line BL1 is maintained at −4.5V (the source of n-channel transistor 120 (bit line BL1) and the drains of p-channel transistor 110 and n-channel transistor 120 (i.e., node A) are floating, and n-well region 115 is grounded (i.e., maintained at 0 Volts)). Note that IPW regions IPW1 and IPW2 serve the purpose of the shared control gate used in co-owned U.S. Pat. No. 6,788,576, thereby allowing memory cell 101 to be fabricated using a CMOS process flow including only a single polysilicon processing step. As indicated in FIG. 5(A), under these voltage conditions electron-hole pairs are generated in the source region 112 of p-channel transistor 110. The electrons are accelerated by a lateral electric field toward the channel region 117 of p-channel transistor 110, and some of these electrons attain high energy. These high-energy electrons pass through tunnel (bottom) oxide 119 separating source region 112 and first floating gate portion 130-1, and become trapped in floating gate structure 130. Similarly, during erase operations, a positive voltage (e.g., +4.5V) is applied to the (N+) source region 122 of n-channel transistor 120 (bit line BL2), and a negative voltage (e.g., −4.5V) is applied to IPW regions IPW1 and IPW2 (the source of p-channel transistor 110, the drains of p-channel transistor 110 and n-channel transistor 120, and n-well region 115 are floating). As indicated in FIG. 5(B), under these voltage conditions, electron-hole pairs are generated in source region 122 of n-channel transistor 120 such that the holes are accelerated by a lateral electric field toward the channel region 127, and causing the injection of BBT holes into second floating gate portion 130-2 (or the back-tunneling of electrons from second floating gate portion 130-2 to source region 122) through lower oxide 129.

The F-N current in the first program/erase stage is typically below 10 nA. The current is measured as $I=C_{IPW\_LARGE}[d(\Delta V_m)/dt_p]$, where $C_{IPW\_LARGE}*\Delta V_m$ is the charge in floating gate 130 that corresponds to the $\Delta V_m$ shift in the position of transfer curves (IPW large stands for IPW1) Typical data is shown in FIGS. 6(A) and 6(B), where FIG. 6(A) shows F-N current during programming, and FIG. 6(B) shows F-N current during erasure. The time constant of the system that supplies program/erase voltages is approximately 5 µs. Thus erase currents are below 100 nA starting from t=0.

Figure 7A:
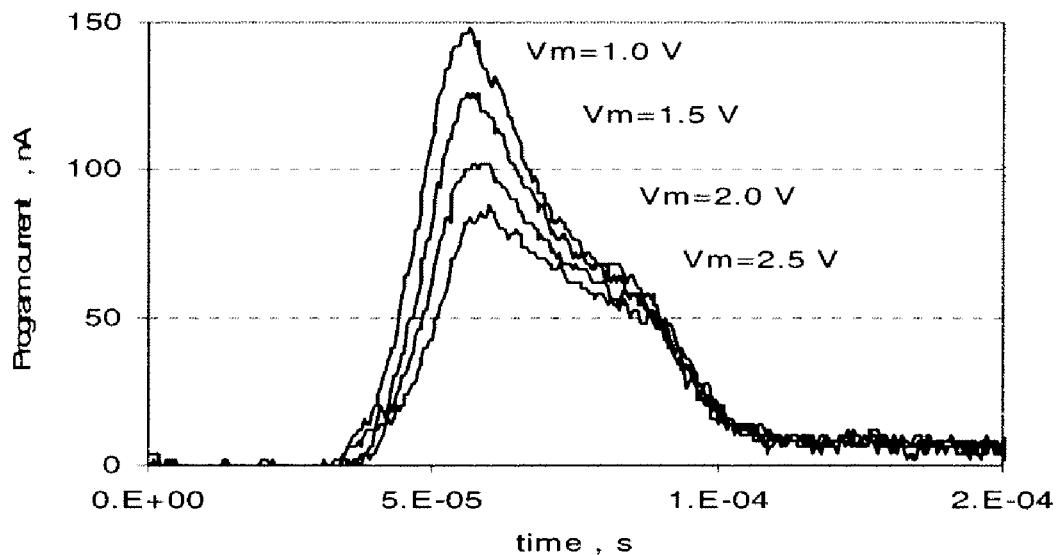
FIGS. 7(A) and 7(B) are graphs showing currents generated in the memory cell of FIG. 1 during the BBT phase of the F-N+BBT scheme for different initial transfer points.
Figure 7B:
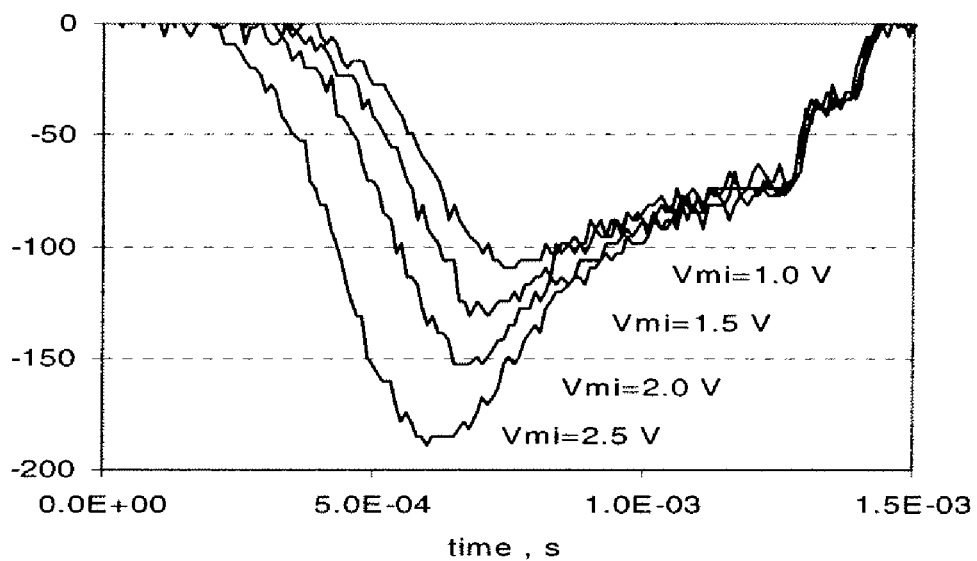

The values of currents (from the BL1 or BL2 nodes to the corresponding wells) at the BBT stage of programming and erase are shown in FIGS. 7(A) and 7(B), where FIG. 7(A) shows currents during the BBT stage of the combined F-N+BBT program operation, and FIG. 7(B) shows currents during the BBT stage of the combined F-N+BBT erase operation. In case BBT programming starts from the negative Vm value and BBT erase from the Vm exceeding +3V, the values of current are on the order of 500 nA. The origin of current is the gate induced drain leakage (GIDL) in the junctions where the BBT currents are generated. With the proposed combined F-N+BBT scheme, one obtains currents at the level of 100 nA, which is suitable for RFID devices. This is achieved due to lower fields in the gate oxide at the beginning of the BBT program/erase stage.

Figure 8:
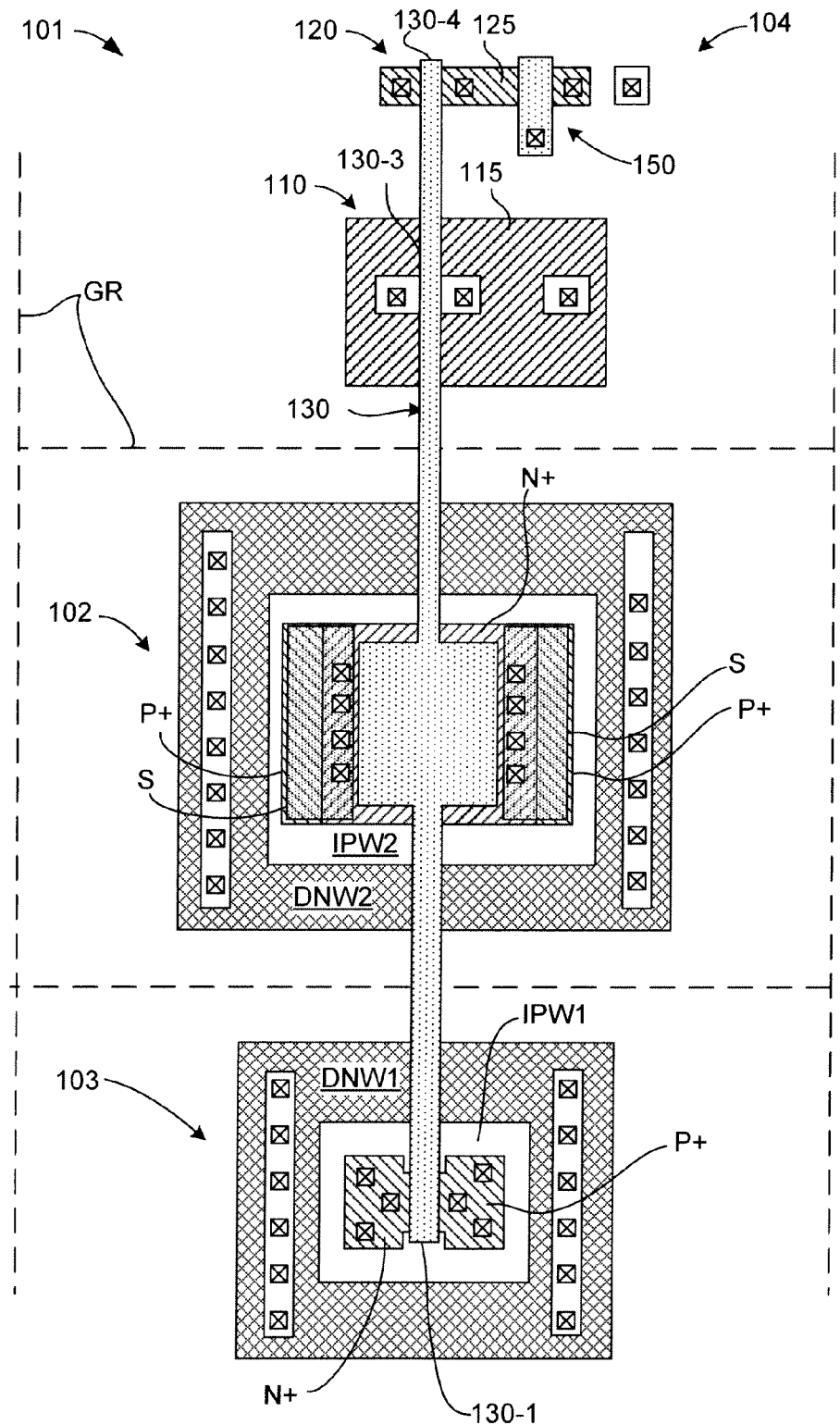
FIG. 8 is a simplified top view showing a layout of the CMOS logic memory cell of FIG. 1 according to another embodiment of the present invention.

FIG. 8 is a top view showing a simplified layout of CMOS logic memory cell 101 according to an embodiment of the present invention. Deep N-well regions DNW1 and DNW2 are spaced apart and respectively contain isolated P-well regions IPW1 and IPW2 along with corresponding N+ and P+ diffusions. N-well region 115 and P-well region 125 are located adjacent to deep N-well region DNW2, and include p-channel transistor 110, n-channel transistor 120 and select transistor 150 of inverter 104. Floating gate structure 130 includes first region 130-1 located over isolated region IPW1, a relatively wide second region 130-2 located over isolated region IPW1, third region 130-3 located over N-well 115, and fourth region 130-4 located over P-2311 125.

As mentioned above, non-volatile cell 101 provides an advantage in that a "standard" CMOS fabrication flow (i.e., a CMOS fabrication flow that is optimized for voltages of 5V or less) may be used without requiring any extra process steps and masks. However, by adding one more mask and etch process steps, a triple gate oxide technology is formed that allows thinner oxide layers D1 and D2. For example, forming oxide layers D1 and D2 with a thickness of 55±10 A is advantageous in that it enables operating voltage reduction to ±3.5V. As mentioned above, the depletion regime in the IPW regions IPW1 and IPW2 is avoided by adding a N+ charge injector regions into the IPW regions. In the embodiment described above, the addition of the N+ regions is achieved by butted salicide diffusions S provided at edges of capacitor 102, as shown in FIG. 8. As used herein, the term "butted salicide" is defined as being formed where N+ and P+ diffusion regions merge (abut) within the substrate, and salicide is formed over both of the N+ and P+ regions. The butted salicide regions serve to provide high capacitance in both accumulation and depletion as follows. When a positive polarity is supplied to IPW region IPW2, IPW region IPW2 is in accumulation, thus the capacitance of IPW region IPW2 is high. In the absence of the N+ region and butted salicide, a pulse of negative voltage would bring IPW region IPW2 into non-equilibrium depletion with low capacitance (depletion layer in series with GOX capacitance). To avoid this low capacitance, the N+ diffusion is added and connected by butted salicide to supply electrons to IPW region IPW2 in inversion, like in a MOS transistor, thus providing high capacitance in both accumulation and depletion.

Well controlled operating potential switching of entire CMOS IC device 100 protects from unwanted current path occurrence (e.g., latch-up). In FIG. 8, a guard ring GR (indicated by dashed lines) is provided using known techniques between deep N-well regions NW1 and NW1 to avoid such effects. As a result, it is possible to use more aggressive layout design rules, significantly, beyond standard DNW design rules in advanced CMOS processes. For example, the space between deep N-well regions DNW1 and DNW2 and between N-well region 115 and deep N-well region DNW2 can be decreased from 2 um to 1.5 um by adding the guard ring.

Feasibility studies were performed using the memory cells fabricated in the 0.18 um CMOS process utilized by the assignee without adding additional masks. Feasibility study was successful and demonstrated a high program margin is obtained with low (<5V) voltages, making the proposed cell well suited for RFID applications, particularly those produced using "single poly" CMOS process flows (i.e., CMOS process flows that include only one polysilicon layer deposition/etch process). Both programming/erase kinetics, read-out peculiarities and reliability were tested.

Although the present invention is described above with reference to a specific embodiment that is optimized for use in passive RFID devise, the novel features of CMOS logic memory cell 101 may be utilized in conjunction with other program/erase schemes in other mobile devices, such as active RFID devices or hand-held devices having a dedicated power source (e.g., a battery). The benefit of using CMOS logic memory cell 101 in such other mobile applications is the ability to perform program/erase operations at low voltages (e.g., 5V or less), which facilitates fabrication using "normal" CMOS process flows (i.e., CMOS logic memory cell 101 does not require a special "thick" gate oxide to support higher program/erase voltage).

In one such alternative program/erase scheme, a programming operation includes applying +5V to IPW regions IPW1 and IPW2, causing these structures to act as a control gate CG. Voltages ranging from −4 to −4.5 V are then applied to p-channel device 110, which causes injection of electrons generated by BBT through the gate oxide of p-channel device 110 into floating gate 130. During the erase −5V is applied to IPW regions IPW1 and IPW2, and voltages in the range of +4 to +4.5V are applied to n-channel device 120, which causes injection of holes generated by BBT through the gate oxide of n-channel device 120 into floating gate 130. The advantages of this alternative program/erase scheme are that relatively low voltages are applied across p-channel device 110 and n-channel device 120, which allows these devices and peripheral devices forming control circuit 160 to remain relatively thin (i.e., modifications to a "normal" CMOS process flow are not required to support CMOS logic memory cell 101).

In a second alternative program/erase scheme, both program and erase operations are performed using F-N injection. During programming, +4.5 to +5V is applied to IPW region IPW2 and −4.5 to −5V is applied to IPW region IPW1 to produce F-N injection of electrons into floating gate 130. Conversely, during erase, −4.5 to −5V is applied to IPW region IPW2 and +4.5 to +5V is applied to IPW region IPW1 to produce F-N injection of electrons from the floating gate 130. Note that the capacitance of capacitor 102 (IPW region IPW2) is approximately 26 times greater than the capacitance of capacitor 103 (IPW region IPW1).

Figure 9:
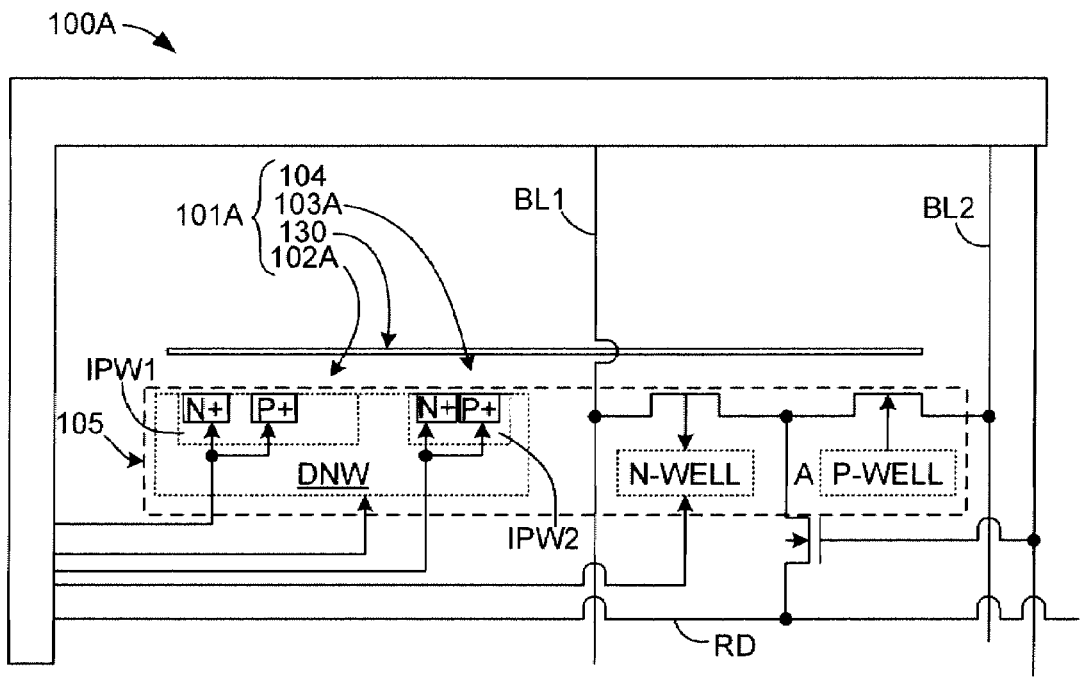
FIG. 9 is a modified schematic view showing a CMOS IC device including an electrically erasable and programmable CMOS logic memory cell according to another embodiment of the present invention.
Figure 10:
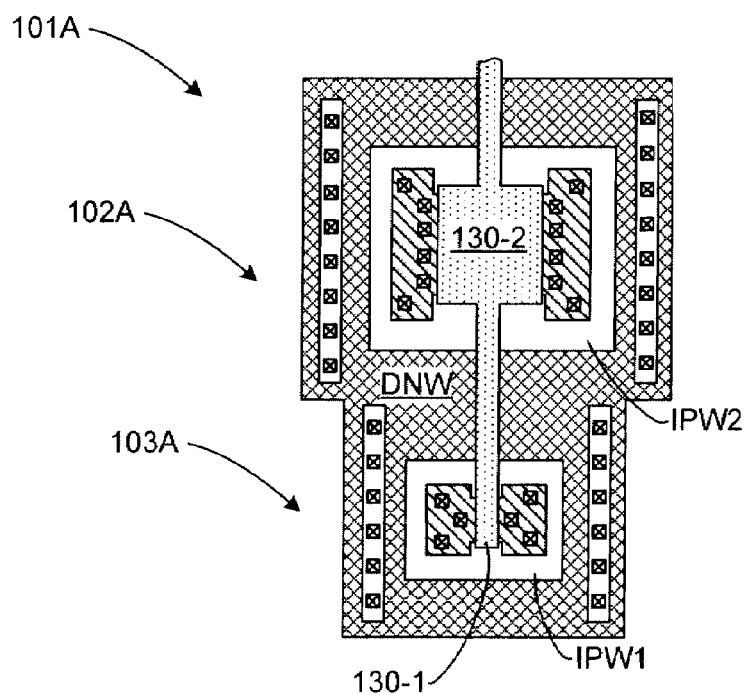
FIG. 10 is a simplified top view showing a portion of the logic memory cell of FIG. 9.

FIG. 9 is a modified schematic diagram showing a portion of a CMOS IC 100A including an electrically erasable and programmable CMOS logic memory cell 101A according to an alternative embodiment of the present invention. CMOS logic memory cell 101A is essentially identical to CMOS logic memory cell 101 (described above) in that it includes two capacitors 102A and 103A and a CMOS complementary non-volatile memory (CNVM) inverter 104 that are fabricated in a common semiconductor (e.g., silicon) substrate 105 such that they share a single polycrystalline silicon (polysilicon) floating gate 130. However, as shown in FIG. 9 (and also in top view in FIG. 10), CMOS logic memory cell 101A differs from CMOS logic memory cell 101 in that both IPW regions IPW1 and IPW2 of capacitors 102A and 103A are formed in a single continuous (shared) deep N-well region DNW, whereby a significant decrease in cell size (i.e., substrate surface area) is achieved because the space required to separate deep N-well regions is very area consuming. The phase "single continuous deep N-well region" is used herein to denote a continuous doped region, as opposed to the separated deep N-well regions described in the first embodiment above. The operation of CMOS logic memory cell 101A is similar to that of cell 101, and typical operating conditions for cell 101 (F-N programming only) are summarized in the Table 1 (below).

Figure 11:
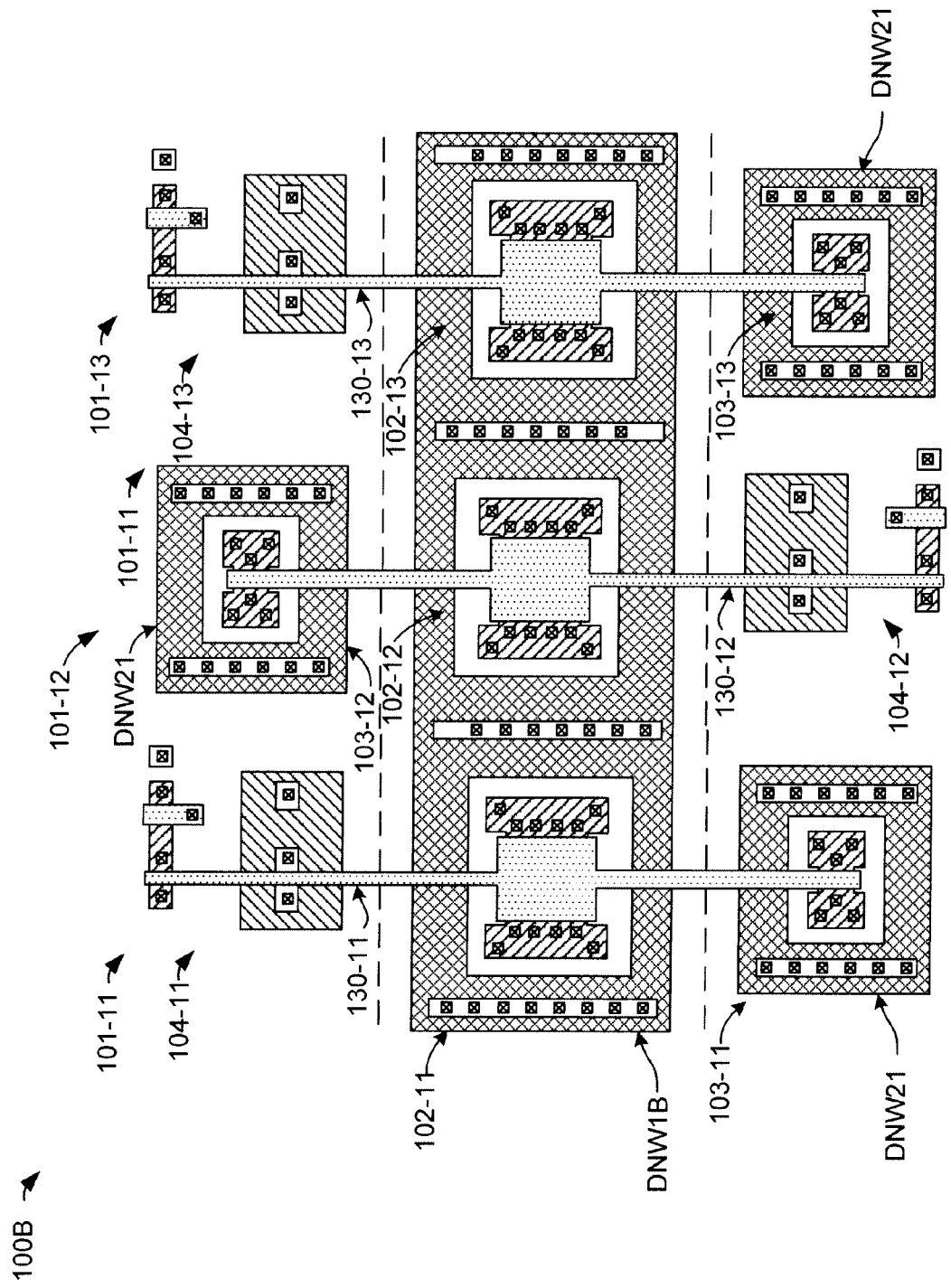
FIG. 11 is a top view showing a portion of a CMOS IC device including three electrically erasable and programmable CMOS logic memory cells arranged in a row according to another embodiment of the present invention.

FIG. 11 is a simplified diagram showing a portion of a CMOS IC 100B including three electrically erasable and programmable CMOS logic memory cells 101-11, 101-12 and 101-12 arranged in a row according to another alternative embodiment of the present invention. Similar to cell 101 (described above), each cell 101-11, 101-12 and 101-12 includes first and second IPW capacitor, an inverter and a polysilicon floating gate. For example, cell 101-11 includes a first capacitor 102-11, a second capacitor 103-11, an inverter 104-11 and a floating gate 130-11. Similarly, cell 101-12 includes first capacitor 102-12, second capacitor 103-12, inverter 104-12 and floating gate 130-12, and cell 101-13 includes first capacitor 102-13, second capacitor 103-13, inverter 104-13 and floating gate 130-13.

In accordance with a first aspect of the embodiment shown in FIG. 11, cells 101-11, 101-12 and 101-12 are arranged in a highly space-efficient manner by inverting the orientation of adjacent cells, i.e., such that inverter 104-12 of cell 101-12 is located between deep N-wells DNW21 and DNW23 of cells 101-11 and 101-13, respectively. By offsetting the deep N-wells of adjacent cells in each row, the arrangement shown in FIG. 11, the DNWs of the large capacitors are now merged, which saves space compared with the case when each of IPW is in its own DNW.

Figure 12:
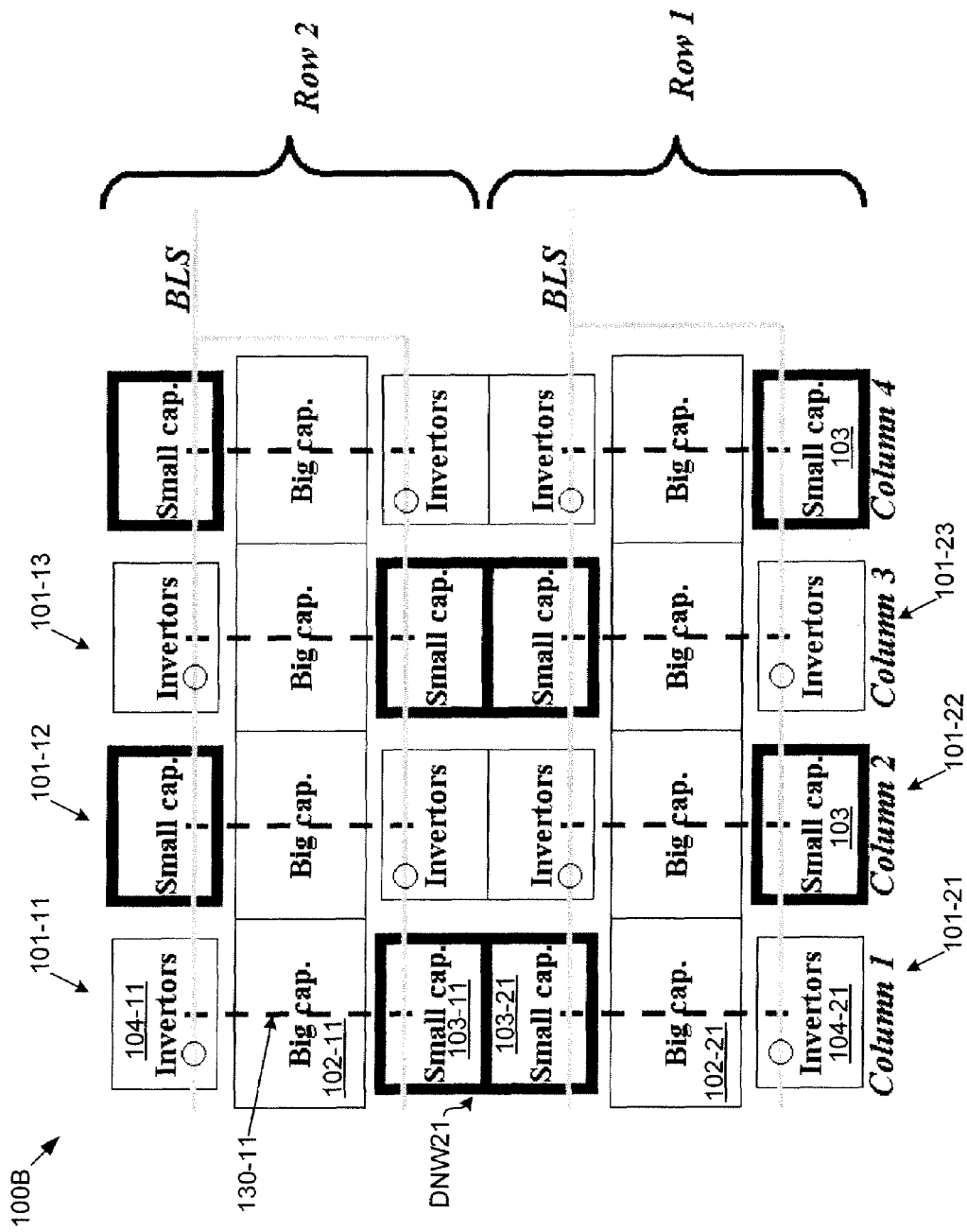
FIG. 12 is a simplified layout diagram showing a larger portion of the CMOS IC device of FIG. 11.

In accordance with a second aspect of CMOS IC 100B, cells 101-11, 101-12 and 101-12 are further arranged in a highly space-efficient manner by sharing deep N-well region DNW1 between cells 101-11, 101-12 and 101-12. That is, large capacitors 102-11, 102-12 and 102-13 are all formed in a single deep N-well region. As indicated in the simplified diagram shown in FIG. 12, this arrangement facilitates connecting the deep N-wells of the big IPW capacitors and the IPWs themselves in rows, while the deep N-wells of small IPW capacitors and corresponding IPWs are connected in columns.

Referring again to FIG. 12, in accordance with another aspect of CMOS IC 100B, adjacent cells in a single column are inverted in order to facilitate sharing of a single deep N-well region by the smaller (second) capacitors of the adjacent cells. For example, cell 101-11 is inverted with respect to cell 101-21, which is disposed in a second column of CMOS IC 100B and below cell 101-11. As shown, a single continuous deep N-well region DNW21 is shared by capacitors 103-11 and 103-21 (i.e., the IPW regions of capacitors 103-11 and 103-21 are formed in separate regions of shared deep N-well region DNW21), thereby providing a further space-saving feature.

Although the present invention has been described with respect to certain specific embodiments, it will be clear to those skilled in the art that the inventive features of the present invention are applicable to other embodiments as well, all of which are intended to fall within the scope of the present invention. For example, in addition to the capacitors described herein, other capacitor structures may be utilized in the fabrication of the RFID memory cells, such as interdigitated capacitors disclosed, for example, in U.S. Pat. No. 6,788,576, which is cited above. In addition, three-dimensional control gate structures, such as those disclosed in co-owned U.S. patent application Ser. No. 11/326,582, filed Jan. 4, 2006, entitled "THREE DIMENSIONAL CONTROL-GATE ARCHITECTURE . . . ", which is also incorporated herein by reference in its entirety.

The invention claimed is:

1. A complimentary metal-oxide-silicon (CMOS) integrated circuit (IC) device including a plurality of non-volatile logic cells, each non-volatile logic cell comprising:
    a polycrystalline silicon floating gate; and
    means for changing a charge stored on the floating gate from an initial charge value to a final charge value, said means comprising:
        first means, capacitively coupled to a first region of the floating gate, for changing the charge stored on the floating gate from the initial charge value to an intermediate charge value by inducing Fowler-Nordheim injection between said first means and the first region

TABLE 1

|  | DNW | IPW1 | IPW2 | FG (appr.) | N-Well | BL1 | BL2 | RD | |
|---|---|---|---|---|---|---|---|---|---|
| Program | 5.0 V | 5.0 V | −5.0 V | 4.5 V | 0 V | 0 V | 0 V | 0 V | |
| Verify | 5.0 V | >1.5 V | 0 V | sweep | 1.5 V | 1.5 V | 0 V | Max-PS | Sweep FG in verify |
| Erase | 5.0 V | −5.0 V | 5.0 V | −4.5 V | 0 V | 0 V | 0 V | 0 V | |
| Verify | 5.0 V | <0 V | 0 V | sweep | 1.5 V | 1.5 V | 0 V | Max-PS | Sweep FG in verify |
| Read | 1.5 V | 1.5 V | 1.5 V | 1.5 V | 1.5 V | 1.5 V | 0 V | Read | According to FG state | of the floating gate, the intermediate charge value being between the initial charge value and the final charge value; and second means, disposed adjacent to a second region of the floating gate, for changing the charge stored on the floating gate from the intermediate charge value to the final charge value by inducing Band-to-Band tunneling between said second means and the second region of the floating gate.

2. The CMOS IC device of claim 1, wherein said first means comprises:

a first capacitor including a first portion of the floating gate, a first isolated P-well region disposed adjacent to the first portion of the floating gate, and a first dielectric region disposed between the first portion of the floating gate and the first isolated P-well region; and a second capacitor including a second portion of the floating gate, a second isolated P-well region disposed adjacent to the second portion of the floating gate, and a second dielectric region disposed between the second portion of the floating gate and the second isolated P-well region, and wherein said CMOS IC device further comprises means for controlling voltage levels of the first and second isolated P-well regions such that a negative voltage is applied to the first isolated P-well region and a positive voltage is applied to the second isolated P-well region during said induced Fowler-Nordheim injection.

3. The CMOS IC device of claim 2, wherein said each of said first and second capacitors include a highly doped N+ region and a highly doped P+ region disposed in said first and second isolated P-well region, respectively.

4. The CMOS IC device of claim 2, wherein said second means comprises:

a CMOS inverter including:

a PMOS transistor comprising a third portion of the floating gate, a first source region, and a first drain region, and an NMOS transistor comprising a fourth portion of the floating gate, a second source region, and a second drain region, the second drain region being electrically connected to the first drain region; and wherein said CMOS IC device further comprises means for controlling voltage levels of the first and second source regions and the first and second isolated P-well regions such that the first and second isolated P-well regions are maintained at one of a positive and a negative voltage level during said induced Band-to-Band tunneling, and the other of said positive and a negative voltage level is applied to one of the first source region and the second source region during said induced Band-to-Band tunneling.

5. A complimentary metal-oxide-silicon (CMOS) integrated circuit (IC) device including a plurality of non-volatile logic cells formed on a substrate, each non-volatile logic cell comprising:

a polycrystalline silicon floating gate disposed over the substrate;

a first capacitor including a first portion of the floating gate and a first isolated P-well region formed in the substrate below the first portion of the floating gate;

a second capacitor including a second portion of the floating gate and a second isolated P-well region formed in the substrate below the second portion of the floating gate; and a non-volatile p-channel transistor including a first source region and a first drain region disposed in an N-well region formed in the substrate adjacent to a third portion of the floating gate, wherein said CMOS IC device further comprises:

means for controlling said first and second capacitors such that Fowler-Nordheim injection is induced between said second isolated P-well region and said second region of the floating gate during a first phase of a program/erase operation, and means for controlling said first and second capacitors and said non-volatile p-channel transistor such that Band-to-Band tunneling is induced between the first source region of said p-channel transistor and said third portion of the floating gate during a second phase of the program/erase operation.

6. The CMOS IC device of claim 5, wherein each non-volatile logic cell further comprises an non-volatile n-channel transistor including a second source region and a second drain region disposed in a P-well region formed in the substrate adjacent to a fourth section of the floating gate, wherein the first drain is connected to the second drain.

7. The CMOS IC device of claim 5, wherein the first isolated P-well region of the first capacitor of each said non-volatile logic cell is formed in a first deep N-well region, and wherein the second isolated P-well region of the second capacitor of each said non-volatile logic cell is formed in a second deep N-well region, that is spaced from the first deep N-well region.

8. The CMOS IC device of claim 5, wherein the first isolated P-well region of the first capacitor and the second isolated P-well region of the second capacitor of each said non-volatile logic cell are formed in a single deep N-well region.

9. The CMOS IC device of claim 5, further comprising means for controlling said first and second capacitors such that Fowler-Nordheim injection is induced between said second isolated P-well region and said second region of the floating gate during a program/erase operation.

10. A complimentary metal-oxide-silicon (CMOS) integrated circuit (IC) device including a plurality of non-volatile logic cells formed on a substrate, each non-volatile logic cell comprising:

a polycrystalline silicon floating gate disposed over the substrate;

a first capacitor including a first portion of the floating gate and a first isolated P-well region formed in the substrate below the first portion of the floating gate;

a second capacitor including a second portion of the floating gate and a second isolated P-well region formed in the substrate below the second portion of the floating gate;

a non-volatile p-channel transistor including a first source region and a first drain region disposed in an N-well region formed in the substrate adjacent to a third portion of the floating gate; and means for controlling said first and second capacitors and said non-volatile p-channel transistor such that Band-to-Band tunneling generation and electron/hole injection are induced between said first source region and said third portion of the floating gate during a program/erase operation.

11. The CMOS IC device of claim 10, wherein said plurality of non-volatile memory cells includes a first memory cell, a second memory cell and a third memory cell arranged in a row such that the second member cell is disposed between the first and third memory cells, wherein each of said first, second and third memory cells are arranged such that the first capacitor is located between said non-volatile p-channel transistor and said second capacitor, and wherein the second memory cell is inverted relative to the first and third memory cells such that said non-volatile p-channel transistor of said second memory cell is disposed between the second capacitors of said first and third memory cells.

12. The CMOS IC device of claim 10, wherein the first isolated P-well regions of the first capacitors of each of said first, second and third memory cells are disposed in a single, continuous deep N-well region.

13. The CMOS IC device of claim 10, further comprising a fourth said non-volatile memory cell disposed in a column with said first memory cell, wherein said fourth memory cell is inverted relative to the first memory cell such that said second capacitor of the first memory cell is disposed adjacent to the second capacitor of said fourth memory cell, and wherein the second isolated P-well regions of the second capacitors of both said first and fourth memory cells are disposed in a single, continuous deep N-well region.

\* \* \* \* \*